US011495636B2

(12) United States Patent
Kumura

(10) Patent No.: US 11,495,636 B2
(45) Date of Patent: Nov. 8, 2022

(54) NONVOLATILE MEMORY DEVICE HAVING A RESISTANCE CHANGE MEMORY ELEMENT AND SWITCHING ELEMENT PORTIONS SERIALLY CONNECTED THERETO

(71) Applicant: KIOXIA CORPORATION, Tokyo (JP)

(72) Inventor: Yoshinori Kumura, Seoul (KR)

(73) Assignee: KIOXIA CORPORATION, Tokyo (JP)

( * ) Notice: Subject to any disclaimer, the term of this patent is extended or adjusted under 35 U.S.C. 154(b) by 308 days.

(21) Appl. No.: 16/817,078

(22) Filed: Mar. 12, 2020

(65) Prior Publication Data

US 2021/0083000 A1 Mar. 18, 2021

(30) Foreign Application Priority Data

Sep. 18, 2019 (JP) .............................. JP2019-169326

(51) Int. Cl.
*H01L 27/22* (2006.01)
*H01L 43/12* (2006.01)
*H01L 43/02* (2006.01)

(52) U.S. Cl.
CPC ............ *H01L 27/224* (2013.01); *H01L 43/02* (2013.01); *H01L 43/12* (2013.01)

(58) Field of Classification Search
CPC ........ H01L 27/224; H01L 43/02; H01L 43/12
USPC ....................................................... 257/427
See application file for complete search history.

(56) References Cited

U.S. PATENT DOCUMENTS

| 8,411,493 | B2 | 4/2013 | Katti | |
|---|---|---|---|---|
| 10,134,459 | B2 | 11/2018 | Toh et al. | |
| 2010/0039136 | A1* | 2/2010 | Chua-Eoan | H03K 19/1776 326/38 |
| 2011/0216580 | A1* | 9/2011 | Berger | G11C 11/1673 365/158 |
| 2014/0098594 | A1* | 4/2014 | Azuma | G11C 13/0007 365/148 |
| 2016/0379701 | A1 | 12/2016 | Nakatsuka et al. | |

(Continued)

FOREIGN PATENT DOCUMENTS

JP 5676177 B2 1/2015

OTHER PUBLICATIONS

Kim, et al., "Breakthrough of Selector Technology for cross-point 25-nm ReRAM", 2017 IEEE International Electron Devices Meeting (IEDM), 2017, p. 2.1.1-2.1 4.

*Primary Examiner* — Duy T Nguyen
(74) *Attorney, Agent, or Firm* — Holtz, Holtz & Volek PC

(57) ABSTRACT

According to one embodiment, a nonvolatile memory device includes a plurality of wiring line pairs each including a pair of first and second wiring lines extending in a first direction, a plurality of third wiring lines each extending in a second direction intersecting the first direction, and a plurality of memory cells provided between the wiring line pairs and the third wiring lines. Each of the memory cells includes a resistance change memory element connected to the third wiring line, and a switching element structure including a first switching element portion provided between the resistance change memory element and the first wiring line, and a second switching element portion provided between the resistance change memory element and the second wiring line.

16 Claims, 12 Drawing Sheets

(56) References Cited

U.S. PATENT DOCUMENTS

2017/0076770 A1\* 3/2017 Daibou ................ H01L 27/228
2019/0074429 A1\* 3/2019 Karpov ................ H01L 43/02

\* cited by examiner

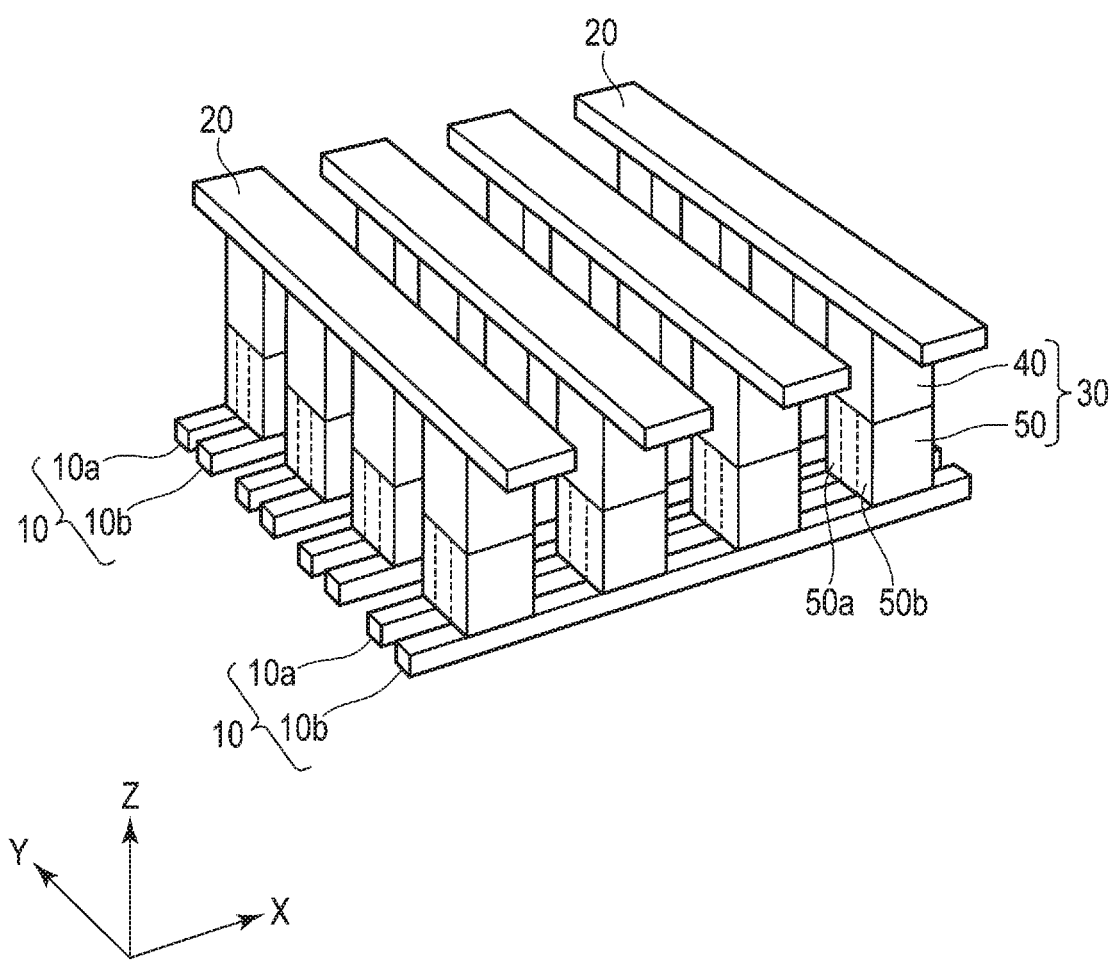
F I G. 1

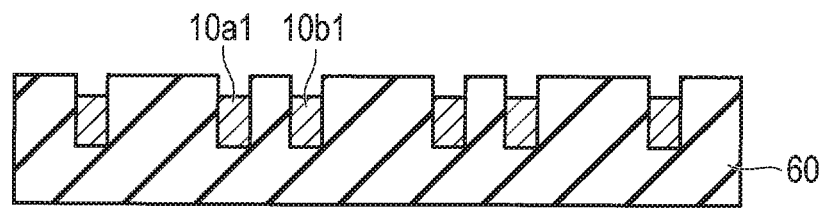
F I G. 5I
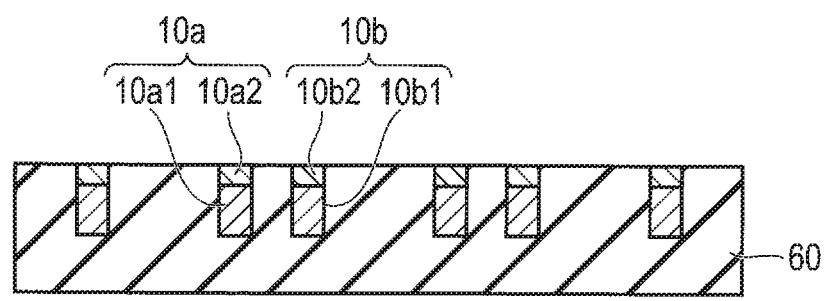
F I G. 5J
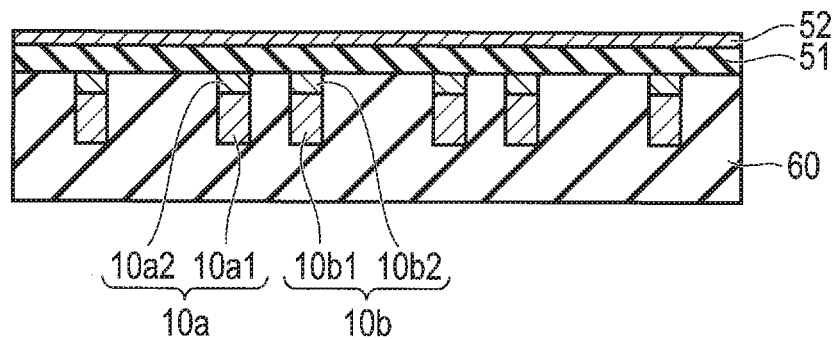
F I G. 5K

NONVOLATILE MEMORY DEVICE HAVING A RESISTANCE CHANGE MEMORY ELEMENT AND SWITCHING ELEMENT PORTIONS SERIALLY CONNECTED THERETO

CROSS-REFERENCE TO RELATED APPLICATIONS

This application is based upon and claims the benefit of priority from Japanese Patent Application No. 2019-169326, filed Sep. 18, 2019, the entire contents of which are incorporated herein by reference.

FIELD

Embodiments described herein relate generally to a nonvolatile memory device.

BACKGROUND

Nonvolatile memory devices (semiconductor integral circuit devices) including a resistance change memory element such as a magnetoresistive element integrated on a semiconductor substrate are proposed. There is a memory cell proposed in which the resistance change memory element and a switching element having a switching function are serially connected in the nonvolatile memory device.

BRIEF DESCRIPTION OF THE DRAWINGS

FIG. 1 is a schematic perspective view of a nonvolatile memory device of an embodiment.

FIGS. 5A, 5B, 5C, 5D, 5E, 5F, 5G, 5H, 5I, 5J, 5K, 5L, 5M, and 5N are schematic cross-sectional views of a manufacturing method of the nonvolatile memory device of the embodiment.

DETAILED DESCRIPTION

Figure 2A:
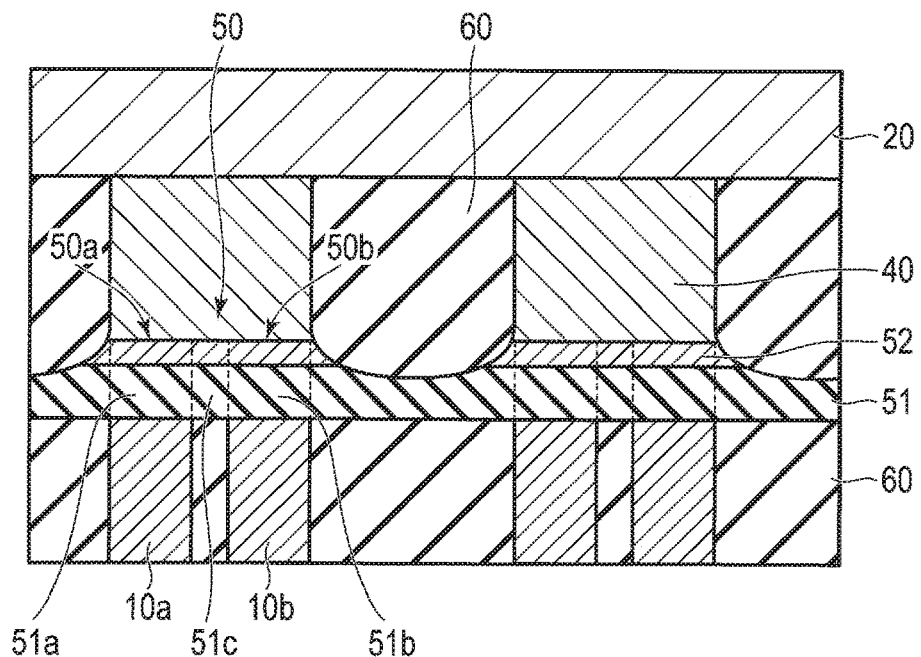
FIGS. 2A and 2B are schematic cross-sectional views of the structure of the nonvolatile memory device of the embodiment.

In general, according to one embodiment, a nonvolatile memory device includes: a plurality of wiring line pairs each including a pair of first and second wiring lines extending in a first direction; a plurality of third wiring lines each extending in a second direction intersecting the first direction; and a plurality of memory cells provided between the wiring line pairs and the third wiring lines, each of the memory cells including: a resistance change memory element connected to a corresponding third wiring line, and a switching element structure including a first switching element portion provided between the resistance change memory element and the first wiring line included in a corresponding wiring line pair, and a second switching element portion provided between the resistance change memory element and the second wiring line included in the corresponding wiring line pair.

Hereinafter, embodiments will be described with reference to the accompanying drawings.

FIG. 1 is a schematic perspective view of the structure (conceptual structure) of a nonvolatile memory device (semiconductor integrated circuit device) of an embodiment. Note that, the structure of FIG. 1 is disposed on a lower structure (not shown) including a semiconductor substrate and a transistor, for example.

As in FIG. 1, the nonvolatile memory device of the present embodiment includes a plurality of wiring line pairs 10 each including a pair of first wiring line 10a and second wiring line 10b extending in a first direction (direction X), a plurality of third wiring lines 20 each extending in a second direction (direction Y) which intersects the first direction, and a plurality of memory cells 30 each disposed between a corresponding wiring line pair 10 and a corresponding third wiring line 20.

In the present embodiment, a wiring line pair 10 of the first wiring line 10a and the second wiring line 10b corresponds to a word line pair, and a third wiring line 20 corresponds to a bit line. The first wiring line (first word line 10a) and the second wiring line (second word line 10b) are apart from each other and extend in parallel to each other in the same direction (direction X). The third wiring line (bit line 20) extends in a direction (direction Y) vertical to the first wiring line (first word line 10a) and the second wiring line (second word line 10b).

The memory cell 30 includes a nonvolatile resistance change memory element 40 and a selector structure (switching element structure) 50 serially connected to the resistance change memory element 40. The selector structure (switching element structure) 50 includes a first selector portion (first switching element portion) 50a disposed between the resistance change memory element 40 and the first wiring line (first word line 10a) and a second selector portion (second switching element portion) 50b disposed between the resistance change memory element 40 and the second wiring line (second word line 10b).

Figure 2B:
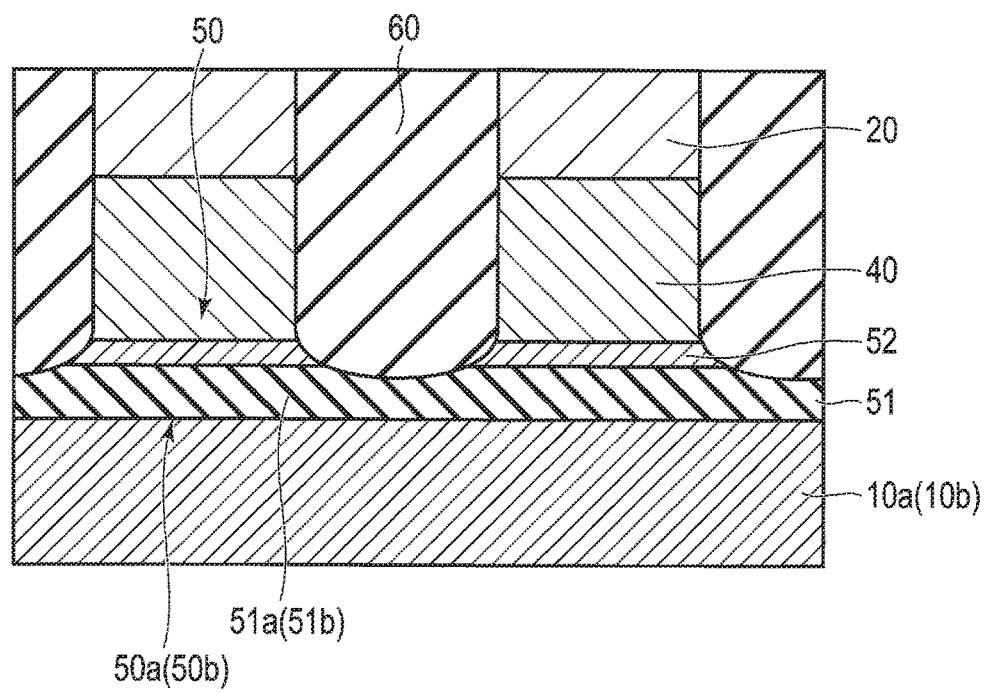

FIGS. 2A and 2B are schematic cross-sectional views of the structure of the nonvolatile memory device of the present embodiment. FIG. 2A is a cross-sectional view taken along a line parallel to the extension direction of the bit line 20 (direction Y). FIG. 2B is a cross-sectional view taken along a line parallel to the extension direction of the word line pair 10 (first word line 10a and second word line 10b) (direction X).

As in FIGS. 2A and 2B, the first selector portion 50a of the selector structure 50 includes a first portion 51a of a selector material layer (switching element material layer) 51 disposed between the first word line 10a and the resistance change memory element 40. The second selector portion 50b of the selector structure 50 includes a second portion 51b of the selector material layer (switching element material layer) 51 disposed between the second word line 10b and the resistance change memory element 40. In FIG. 2A, the first selector portion 50a corresponds to a portion located between a pair of broken lines extending from the first word line 10a, and the second selector portion 50b corresponds to a portion located between a pair of broken lines extending from the second word line 10b.

An electrode 52 is disposed between the selector material layer 51 and the resistance change memory element 40. The electrode 52 functions as a top electrode of the first selector portion 50a and the second selector portion 50b. Furthermore, each of the first word line 10a and the second word line 10b functions as a bottom electrode of the first selector portion 50a and the second selector portion 50b. Note that a first bottom electrode may be disposed between the first selector portion 50a and the first word line 10a while a second bottom electrode may be disposed between the second selector portion 50b and the second word line 10b.

As in FIGS. 2A and 2B, in the present embodiment, the selector material layer 51 is formed continuously. That is, as in FIG. 2A, the first portion 51a of the selector material layer 51 and the second portion 51b of the selector material layer 51 are formed continuously via a third portion 51c of the selector material layer 51. Furthermore, as in FIGS. 2A and 2B, the selector material layer 51 is formed continuously between adjacent memory cells. Specifically, the selector material layer 51 is formed continuously between adjacent memory cells in the extension direction of the word line pair 10 (first word line 10a and second word line 10b) and is formed continuously between adjacent memory cells in the extension direction of the bit line 20.

The selector material layer 51 is formed of, for example, silicon oxide ($SiO_2$) or transition metal oxide such as titanium oxide ($TiO_2$), hafnium oxide ($HfO_2$), or aluminum oxide ($Al_2O_3$). The selector material layer 51 formed of such material is basically an insulative material layer, which changes its resistance according to an applied voltage, as will be described later.

Figure 3:
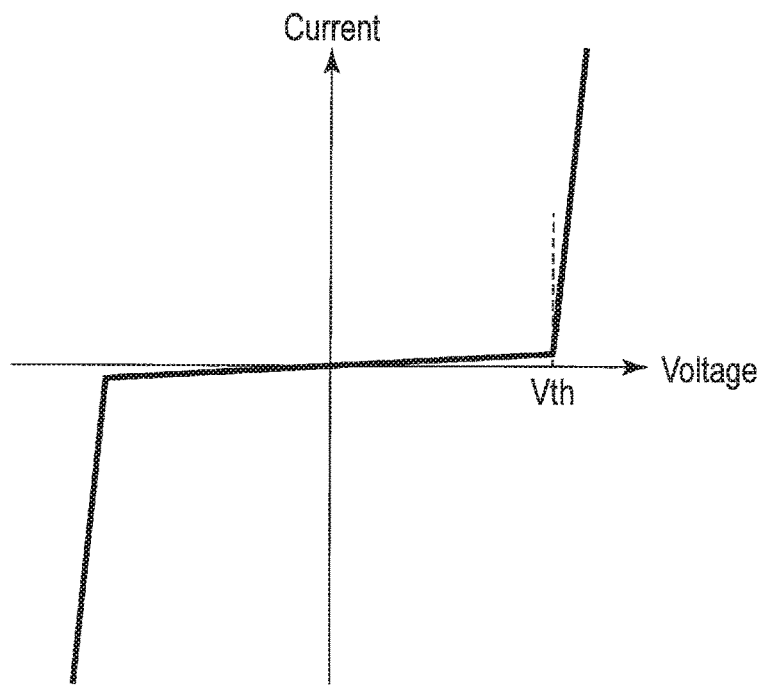
FIG. 3 is a schematic view of a basic current-voltage characteristic of a selector of the nonvolatile memory device of the embodiment.

An interlayer insulative film 60 is formed to surround the above-described word line pair 10 (first word line 10a and second word line 10b), resistance change memory element 40, and selector structure 50. FIG. 3 is a schematic view of a basic current-voltage characteristic of the selector (first selector portion 50a or second selector portion 50b of the selector structure 50) when the above-mentioned selector material is used for the selector material layer 51.

As in FIG. 3, the selector has a nonlinear current-voltage characteristic, and a resistance value of the selector changes according to a voltage applied to the selector (voltage applied between the electrodes between which the selector material layer is interposed). Specifically, the selector may be, for example, a two-terminal (binary) type switching element. If a voltage to be applied between two terminals is less than a threshold value, the switching element is in a high-resistance state, e.g., in an electrically non-conductive state. If a voltage to be applied between two terminals is equal to or greater than a threshold value, the switching element is in a low-resistance state, e.g., in an electrically conductive state.

Figure 4:
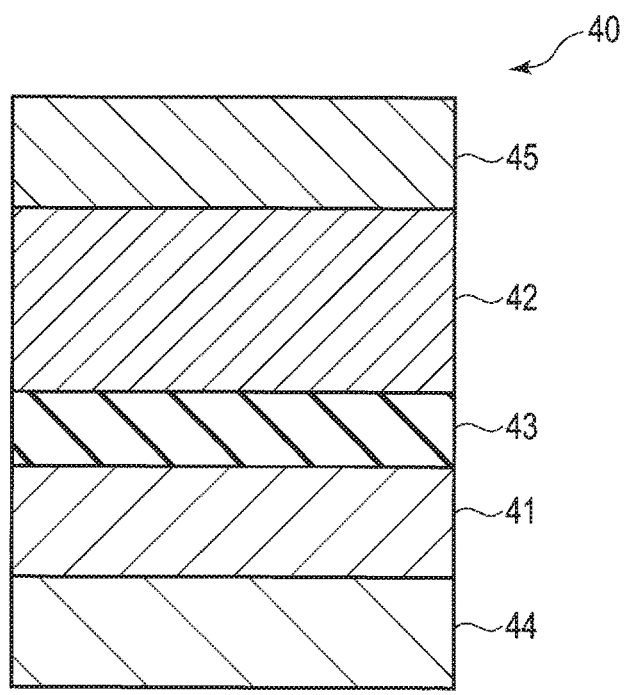
FIG. 4 is a schematic cross-sectional view of the basic structure of a resistance change memory element used for the nonvolatile memory device of the embodiment.

FIG. 4 is a schematic cross-sectional view of the basic structure of the resistance change memory element 40 used for the nonvolatile memory device of the present embodiment. In the present embodiment, a magnetoresistive element is used as the resistance change memory element 40. Note that the magnetoresistive element may be referred to as a magnetic tunnel junction (MTJ) element.

The magnetoresistive element (resistance change memory element) 40 of FIG. 4 is structured such that a stacked structure including a storage layer (first magnetic layer) 41, reference layer (second magnetic layer) 42, and tunnel barrier layer (nonmagnetic layer) 43 disposed between the storage layer 41 and the reference layer 42 is interposed between the bottom electrode 44 and the top electrode 45.

The storage layer (first magnetic layer) 41 is formed of a ferromagnetic layer having a variable magnetization direction. The variable magnetization direction means that the magnetization direction changes with respect to predetermined write current. The storage layer 41 contains at least one of iron (Fe) and cobalt (Co), and may further contain boron (B).

The reference layer (second magnetic layer) 42 is formed of a ferromagnetic layer having a fixed magnetization direction. The fixed magnetization direction means that the magnetization direction does not change with respect to predetermined write current. The reference layer 42 includes a bottom layer portion and a top layer portion. The bottom layer portion contains at least one of iron (Fe) and cobalt (Co), and may further contain boron (B). The top layer portion contains cobalt (Co) and at least one element selected from platinum (Pt), nickel (Ni), and palladium (Pd).

The tunnel barrier layer (nonmagnetic layer) 43 is an insulative layer disposed between the storage layer 41 and the reference layer 42. The tunnel barrier layer 43 contains magnesium (Mg) and oxygen (O).

Note that the above-described stacked structure may further includes a shift canceling layer having a fixed magnetization direction antiparallel to the magnetization direction of the reference layer 42 and canceling a magnetic field applied from the reference layer 42 to the storage layer 41.

The above-described magnetoresistive element 40 is a spin transfer torque (STT) magnetoresistive element and has a perpendicular magnetization. That is, the magnetization direction of the storage layer 41 is perpendicular to the main surface thereof, and the magnetization direction of the reference layer 42 is perpendicular to the main surface thereof.

The above-described magnetoresistive element 40 has a low resistance state where the magnetization direction of the storage layer 41 is parallel to the magnetization direction of the reference layer 42 and a high resistance state where the magnetization direction of the storage layer 41 is antiparallel to the magnetization direction of the reference layer 42. Thus, the magnetoresistive element 40 can store binary data (0 or 1) according to the resistance state (low resistance state and high resistance state). Furthermore, the low resistance state or the high resistance state can be set to the magnetoresistive element 40 depending on a direction of current flowing to the magnetoresistive element 40.

Note that the top electrode 52 of the selector structure 50 (first selector portion 50a and second selector portion 50b) may be used as the bottom electrode 44 of the magnetoresistive element 40. Furthermore, the bit line 20 may be used as the top electrode 45 of the magnetoresistive element 40.

Furthermore, the magnetoresistive element 40 shown in FIG. 4 is a bottom free magnetoresistive element in which the storage layer 41 is disposed on a lower layer side of the reference layer 42, but may be a top free magnetoresistive element in which the storage layer 41 is disposed on an upper layer side of the reference layer 42.

As described above, in the nonvolatile memory device of the present embodiment, two selectors (first selector portion 50a and second selector portion 50b) are disposed in one memory cell 30, and two word lines (first word line 10a and second word line 10b) are connected to one memory cell 30. Thus, for example, if the first selector portion 50a is defective, the second selector portion 50b can be used. That is, by supplying a signal to the second selector portion 50b from the second word line 10b, the memory cell 30 can function properly. Thus, the present embodiment can achieve a nonvolatile memory device which can provide a suitable measure for a defect of the selector. The detailed explanation will be presented in the following.

A general nonvolatile memory device includes one selector in one memory cell, and one word line is connected to one memory cell. Thus, a memory cell including a defective selector cannot be used. Furthermore, defective selectors are mostly caused by a short circuit. Thus, not only in the memory cell including the defective selector but also in a memory cell associated with a word line connected to the memory cell including the defective selector and in a memory cell associated with a bit line connected to the memory cell including the defective selector, malfunction will be occurred.

The present embodiment can avoid the above-mentioned problem, and can achieve an excellent nonvolatile memory device.

Now, a manufacturing method of the nonvolatile memory device of the present embodiment will be explained with reference to FIGS. 5A to 5N.

Figure 5A:
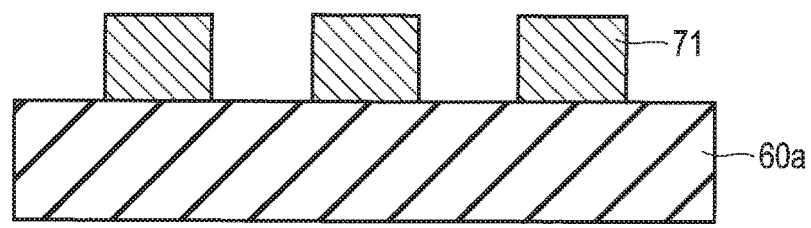

Initially, as in FIG. 5A, a lower structure (not shown) including a semiconductor substrate and a transistor or the like is formed, and then, a silicon nitride film 60a forming a part of the interlayer insulative film 60 shown in FIGS. 2A and 2B is formed on the lower structure. Furthermore, a hard mask pattern 71 is formed on the silicon nitride film 60a.

Figure 5B:
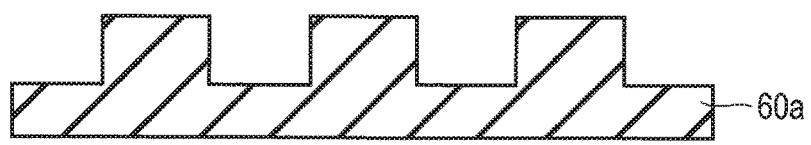

Then, as in FIG. 5B, the silicon nitride film 60a is etched using the hard mask pattern 71 as a mask to form a trench pattern in the silicon nitride film 60a. Furthermore, the hard mask pattern 71 is removed.

Figure 5C:
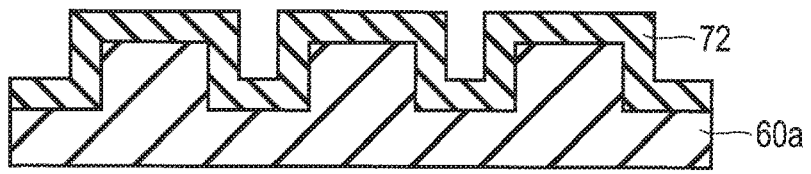

Then, as in FIG. 5C, a silicon oxide film 72 is formed over the entire surface as a sacrificial layer.

Figure 5D:
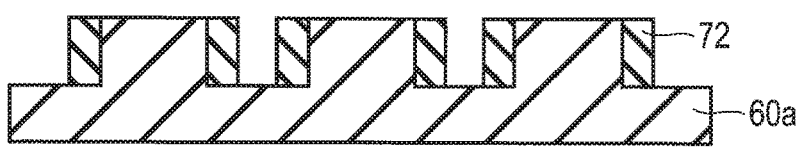

Then, as in FIG. 5D, a side wall portion is formed by etching back the silicon oxide film 72.

Figure 5E:
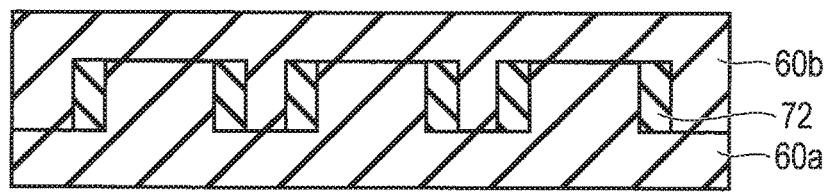

Then, as in FIG. 5E, a silicon nitride film 60b forming a part of the interlayer insulative film 60 shown in FIGS. 2A and 2B is formed over the entire surface.

Figure 5F:
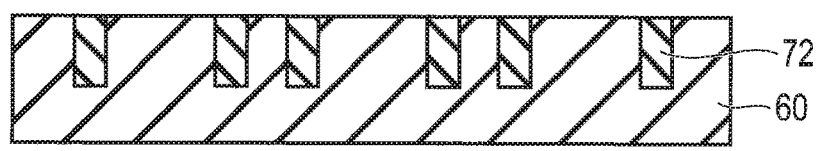

Then, as in FIG. 5F, the silicon nitride film 60b is polished by chemical mechanical polishing (CMP). Through this step, a structure in which a silicon oxide film 72 is embedded in the structure corresponding to the interlayer insulative film 60 shown in FIGS. 2A and 2B can be achieved.

Figure 5G:

Then, as in FIG. 5G, the silicon oxide film (sacrificial film) 72 is removed by wet etching to form a trench in the interlayer insulative film (silicon nitride film) 60.

Figure 5H:
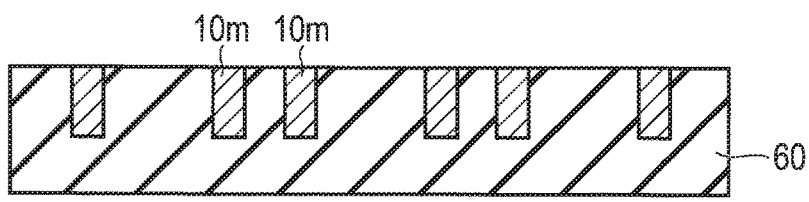

Then, as in FIG. 5H, a main metal layer 10m for the word line is formed over the entire surface and the main metal layer 10m is polished by CMP. Through this step, a structure in which the main metal layer 10m is embedded in the interlayer insulative film (silicon nitride film) 60 is achieved.

Then, as in FIG. 5I, the main metal layer 10m is recessed. Through this step, a main metal portion 10a1 of the first word line 10a and a main metal portion 10b1 of the second word line 10b are formed.

Then, as in FIG. 5J, a barrier metal layer is formed over the entire surface and is flattened by CMP. Through this step, a barrier metal portion 10a2 of the first word line 10a and a barrier metal portion 10b2 of the second word line 10b are formed. Thus, the first word line 10a formed of the main metal portion 10a1 and the barrier metal portion 10a2 and the second word line 10b formed of the main metal portion 10b1 and the barrier metal portion 10b2 are formed.

Then, as in FIG. 5K, a selector material layer 51 is formed over the entire surface, and an electrode layer 52 is formed on the selector material layer 51. The electrode layer 52 is, for example, a titanium nitride (TiN) layer.

Figure 5L:
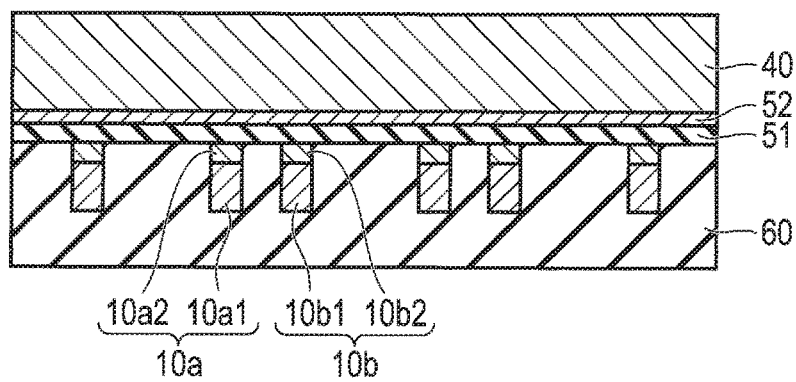

Then, as in FIG. 5L, a magnetoresistive element layer 40 is formed on the electrode layer 52.

Figure 5M:
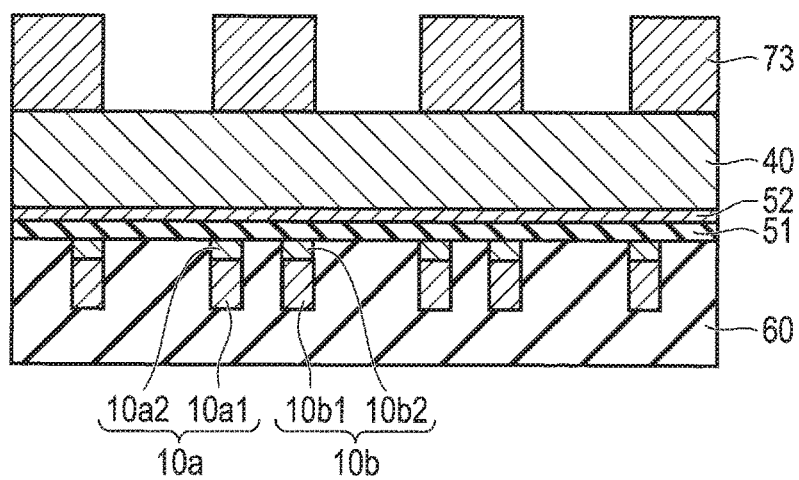

Then, as in FIG. 5M, a hard mask pattern 73 is formed on the magnetoresistive element layer 40.

Figure 5N:
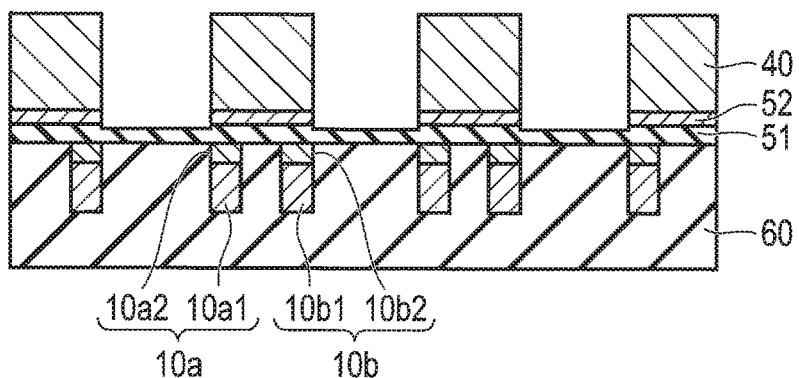

Then, as in FIG. 5N, the magnetoresistive element layer 40 is etched by ion beam etching (IBE) or reactive ion etching (RIE) using the hard mask pattern 73 as a mask. Thus, the magnetoresistive element 40 is formed.

Although the following steps are not illustrated, the interlayer insulative film, bit lines, and the like are formed to achieve the nonvolatile memory device shown in FIGS. 2A and 2B.

In the above-described manufacturing method, the side wall portion of the silicon oxide film (sacrificial film) 72 is formed in the step of FIG. 5D, and the first word line 10a and the second word line 10b are formed using the side wall portion, and thus, fine word lines can be formed. Thus, through the manufacturing method of the present embodiment, two selectors (first selector portion 50a and second selector portion 50b) and two word lines (first word line 10a and second word line 10b) can be formed properly with respect to one memory cell 30.

Figure 6A:
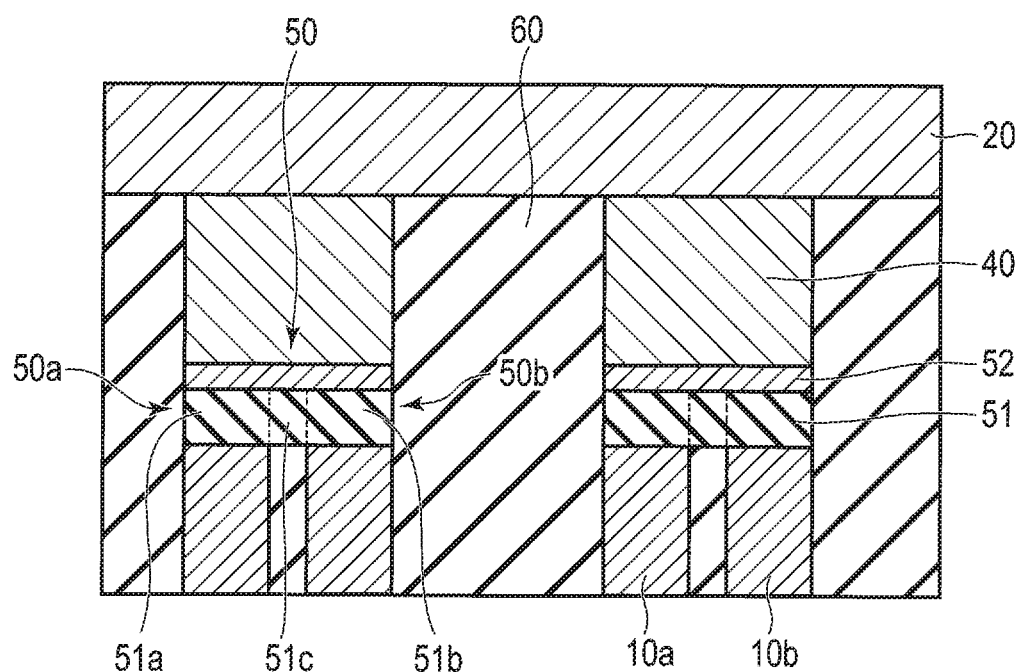
FIGS. 6A and 6B are schematic cross-sectional views of the structure of a first variation of the nonvolatile memory device of the embodiment.
Figure 6B:
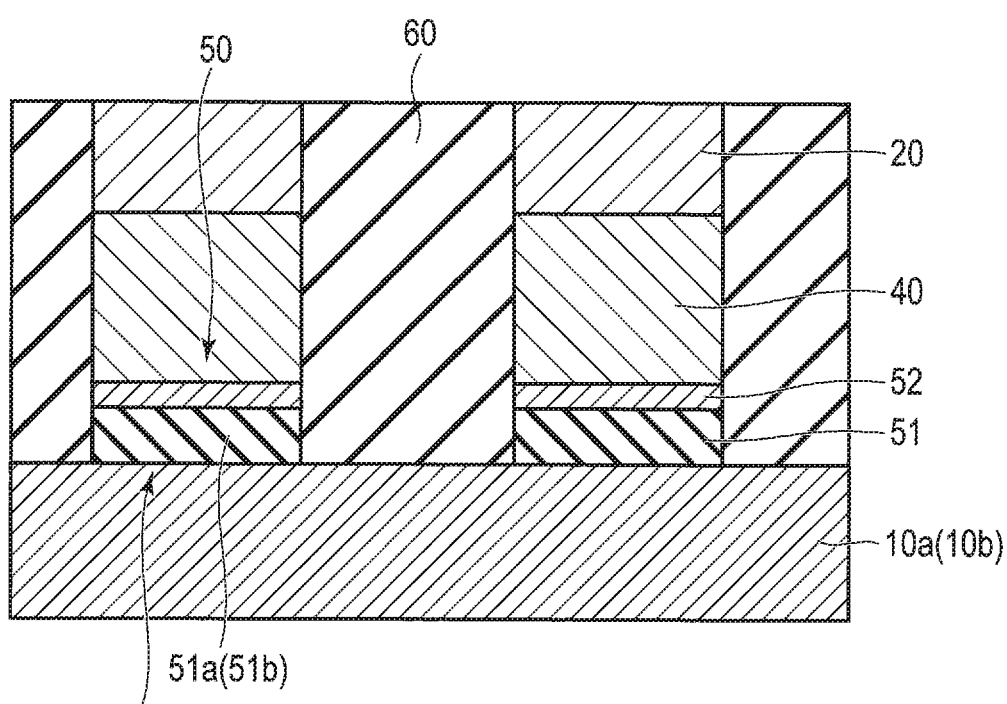

FIGS. 6A and 6B are schematic cross-sectional views of the structure of a first variation of the nonvolatile memory device of the present embodiment. FIG. 6A is a cross-sectional view taken along line parallel to the extension direction (direction Y) of the bit line 20. FIG. 6B is a cross-sectional view taken along line parallel to the extension direction (direction X) of the word line pair 10 (first word line 10a and second word line 10b).

In this variation, the selector material layer 51 is separated between adjacent memory cells. That is, in this variation, the selector material layer 51 is separated between memory cells adjacent to each other in the extension direction of the word line pair 10 (first word line 10a and second word line 10b) (direction X), and are separated between memory cells adjacent to each other in the extension direction of the bit line 20. The other basic structure is the same as that of the above-described embodiment.

In this variation, with the above-described structure, leak current between adjacent memory cells can be suppressed. As a result, an S/N ratio in a read operation can be improved, and power consumption used in a write operation can be suppressed, and the like.

Figure 7A:
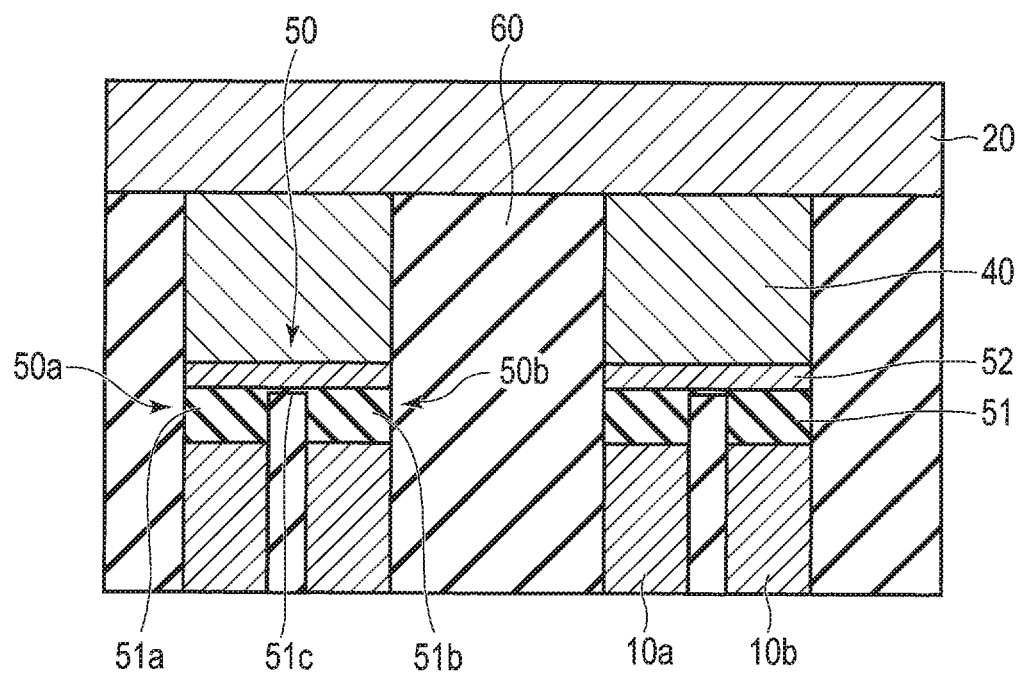
FIGS. 7A and 7B are schematic cross-sectional views of the structure of a second variation of the nonvolatile memory device of the embodiment.
Figure 7B:
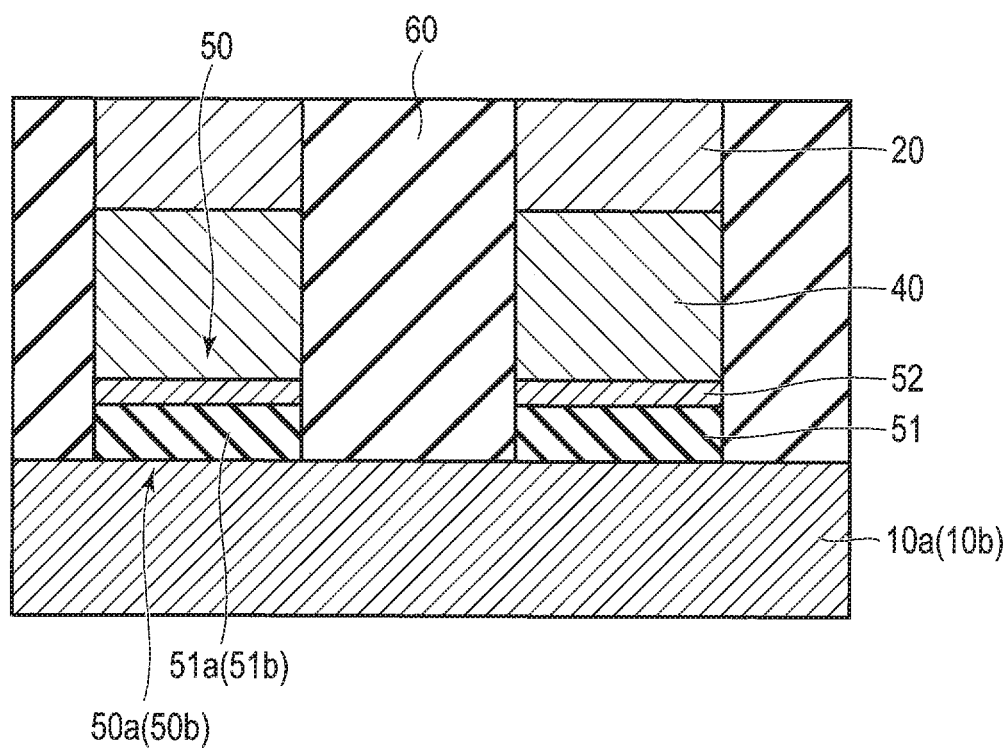

FIGS. 7A and 7B are schematic cross-sectional views of the structure of a second variation of the nonvolatile memory device of the present embodiment. FIG. 7A is a cross-sectional view taken along line parallel to the extension direction (direction Y) of the bit line 20. FIG. 7B is a cross-sectional view taken along line parallel to the extension direction (direction X) of the word line pair 10 (first word line 10a and second word line 10b).

In this variation, a thickness of the third portion 51c of the selector material layer 51 is thinner than a thickness of the first portion 51a and the second portion 51b of the selector material layer 51. The other basic structure is the same as those of the above-described embodiment and first variation.

In this variation, with the above-described structure, leak current between the first selector portion 50a and the second selector portion 50b can be suppressed. As a result, leak current between the first word line 10a and the second word line 10b can be suppressed, and thus, an S/N ratio in a read operation can be improved, and power consumption used in a write operation and the like can be suppressed.

Figure 8A:
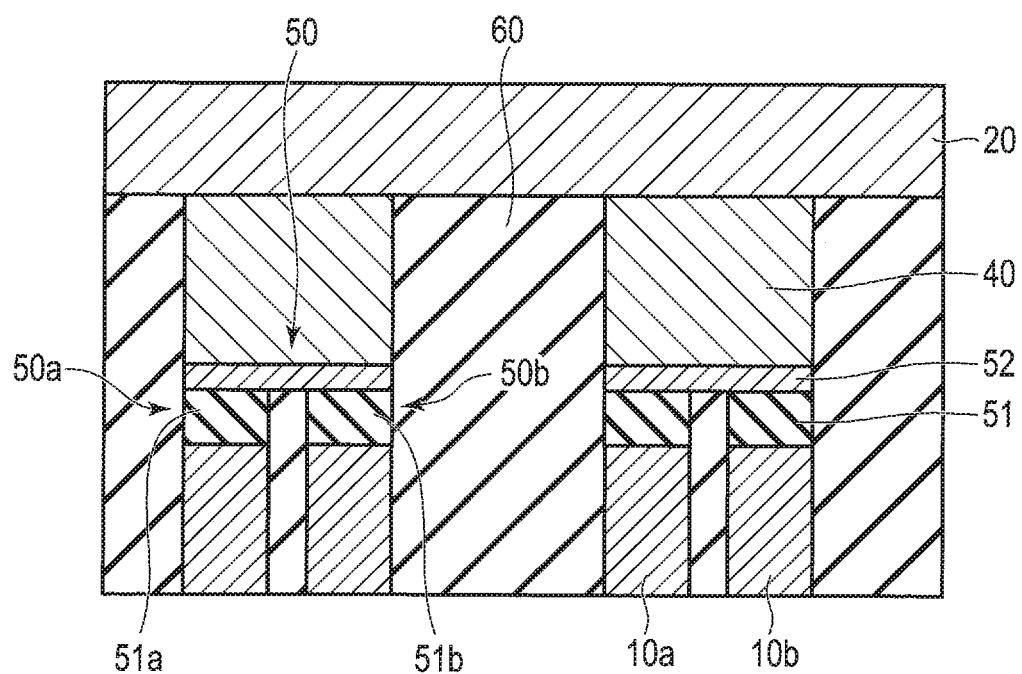
FIGS. 8A and 8B are schematic cross-sectional views of the structure of a third variation of the nonvolatile memory device of the embodiment.
Figure 8B:
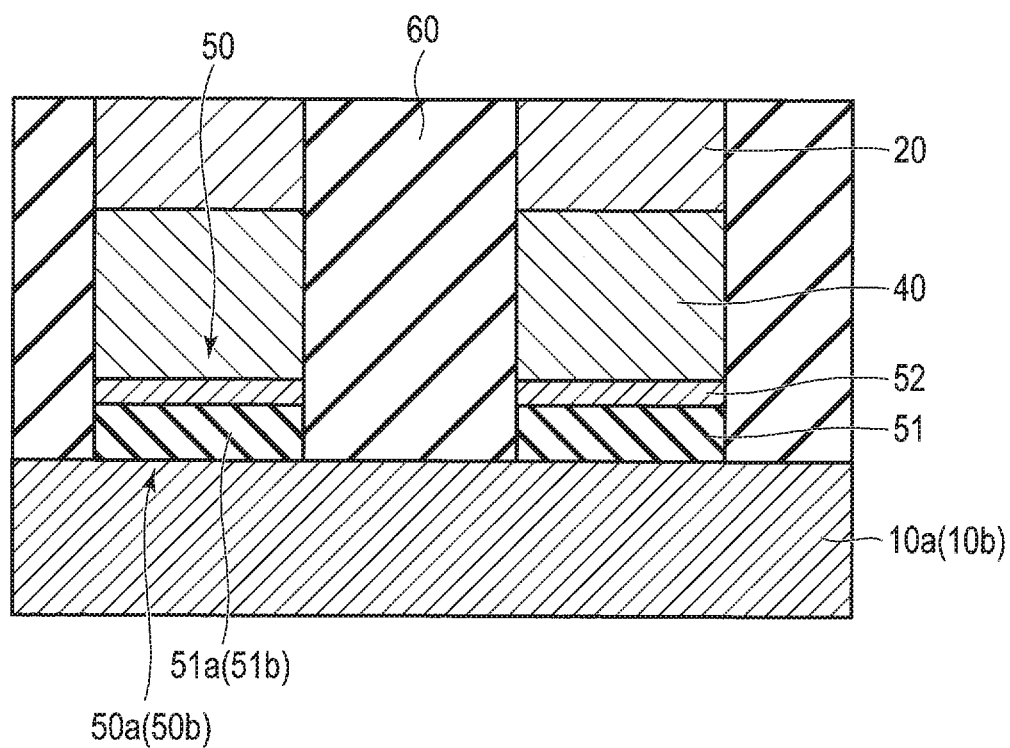

FIGS. 8A and 8B are schematic cross-sectional views of the structure of a third variation of the nonvolatile memory device of the present embodiment. FIG. 8A is a cross-sectional view taken along line parallel to the extension direction (direction Y) of the bit line 20. FIG. 8B is a cross-sectional view taken along line parallel to the extension direction (direction X) of the word line pair 10 (first word line 10a and second word line 10b).

In this variation, the first portion 51a and the second portion 51b of the selector material layer 51 are separated from each other. The other basic structure is similar to those of the above-described embodiment and first variation.

In this variation, with the above-described structure, leak current between the first selector portion 50a and the second selector portion 50b can be suppressed more securely. As a result, leak current between the first word line 10a and the second word line 10b can be suppressed more securely, and thus, an S/N ratio in a read operation can be improved, and power consumption used in a write operation and the like can be suppressed.

Furthermore, in the above-described embodiment, a structure in which the magnetoresistive element (resistance change memory element) 40 formed on the selector structure 50 is used, and instead thereof, a structure in which the selector structure 50 is formed on the magnetoresistive element (resistance change memory element) 40 may be adopted. In this case, the word line pair 10 is provided on the upper layer side, and the bit line 20 is provided on the lower layer side.

Figure 9:
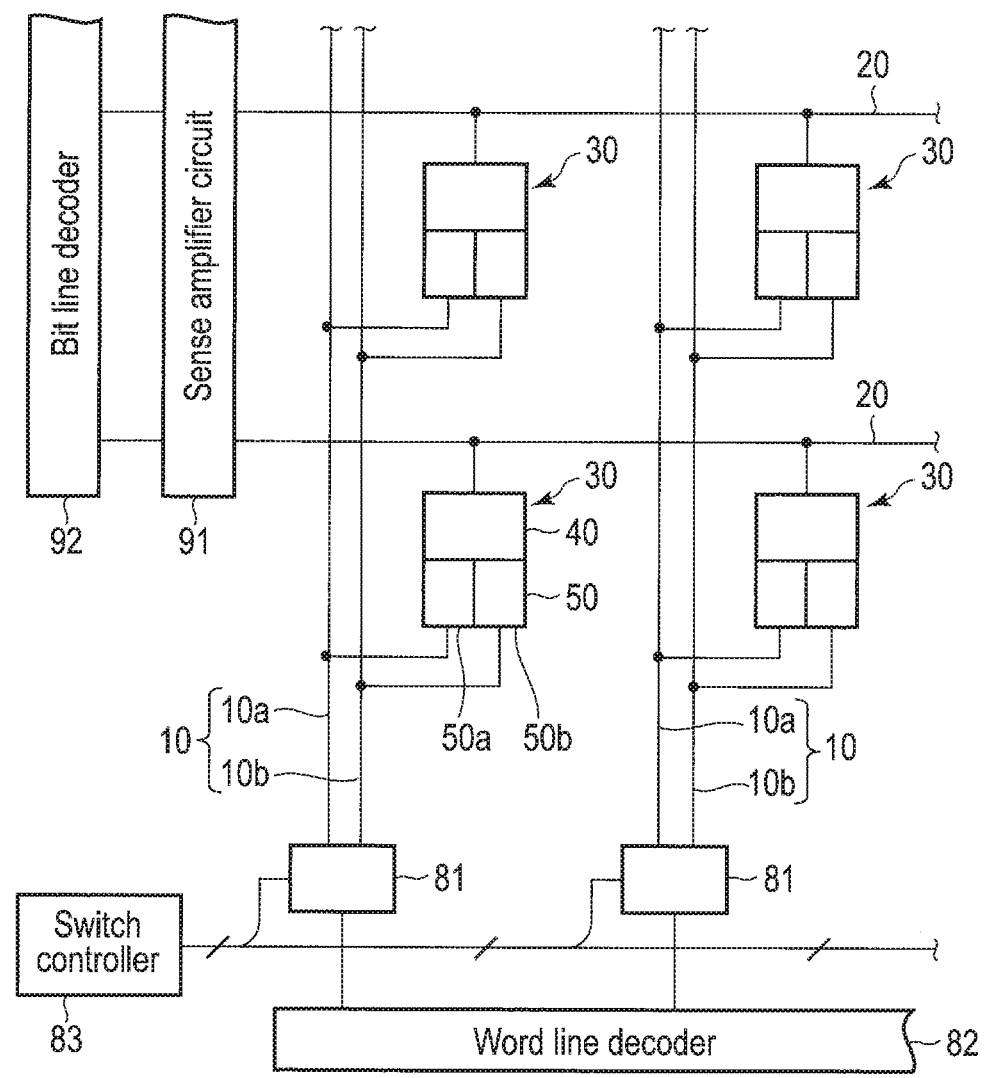
FIG. 9 is a schematic view of a basic circuit structure of the nonvolatile memory device of the embodiment.

FIG. 9 is a schematic view of a basic circuit structure of the nonvolatile memory device of the embodiment.

As in FIG. 9, a common word line pair 10 (first word line 10a and second word line 10b) is connected to memory cells 30 arranged in a vertical direction, and a common bit line 20 is connected to memory cells 30 arranged in a horizontal direction. Specifically, the first word line 10a is connected to the first selector portion 50a of the selector structure 50, and the second word line 10b is connected to the second selector portion 50b of the selector structure 50. Furthermore, the bit line 20 is connected to the magnetoresistive element 40.

A selector circuit 81 is connected to the word line pair 10, and a word line decoder 82 and a switch controller 83 are connected to the selector circuit 81. Furthermore, a sense amplifier 91 is connected to the bit line 20, and a bit line decoder 92 is connected to the sense amplifier 91.

Each selector circuit 81 is controlled individually by the switch controller 83. That is, each selector circuit 81 selects a first word line 10a or a second word line 10b included in a corresponding word line pair 10 based on a control signal from the switch controller 83, and sends a signal from the word line decoder 82 to the selected word line (first word line 10a or second word line 10b). Specifically, the selector circuit 81 is formed of a pair of switch elements (for example, a pair of transistors), and one switch element is connected to the first word line 10a while the other switch element is connected to the second word line 10b. Through a switch element selected by a control signal from the switch controller 83, a signal from the word line decoder 82 is sent to the selected word line (first word line 10a or second word line 10b). Selection of the word line is performed per word line pair 10.

Now, an example of basic operation of the nonvolatile memory device of the present embodiment will be explained with reference to FIG. 9.

In the first example of operation, the selector circuit 81 is controlled to, if one of the first selector portion 50a and the second selector portion 50b is defective, select the other one of the first selector portion 50a and the second selector portion 50b. For example, each selector circuit 81 selects, if the first selector portion 50a included in any memory cell 30 connected to a corresponding word line pair 10 is defective, the second word line 10b included in the corresponding word line pair 10.

For example, the first word line 10a is selected in any word line pair 10 in the initial state, and at the initial stage or at predetermined intervals, the memory cell 30 is checked. As a result of the check, if defect of the first selector portion 50a included in a certain memory cell 30 (for example, lower left memory cell 30 of FIG. 9) is detected, the selector circuit 81 is controlled to switch the first word line 10a connected to the memory cell 30 from which the defect is detected (for example, lower left memory cell 30 of FIG. 9) to the second word line 10b.

Thus, in this example of operation, by switching one of the selector portions which is defective to the other one of the selector portions (switching word line), yield and life of the nonvolatile memory device can be improved. That is, a defective selector is switched in the initial stage, thereby the yield of the nonvolatile memory device can be practically improved. Furthermore, a defect check is performed at predetermined intervals to switch a defective selector to a proper selector, and thus, the life of the nonvolatile memory device can be improved.

In a second example of operation, selection of word line is switched based on a predetermined number of rewrites. For example, it is assumed that the first word line 10a is selected in any word line pair 10 in the initial state. The selector circuit 81 is controlled such that, when the number of total rewrites for the nonvolatile memory device reaches a predetermined number, the first word line 10a is switched to the second word line 10b in every word line pair 10.

As above, in this example of operation, the selection of word line is switched based on a predetermined number of rewrites, and thus, switching of one selector portion to other selector portion can be performed before defect of selectors caused by increase of the number of rewrites occurs. Thus, the life of nonvolatile memory device can be improved.

Figure 10:
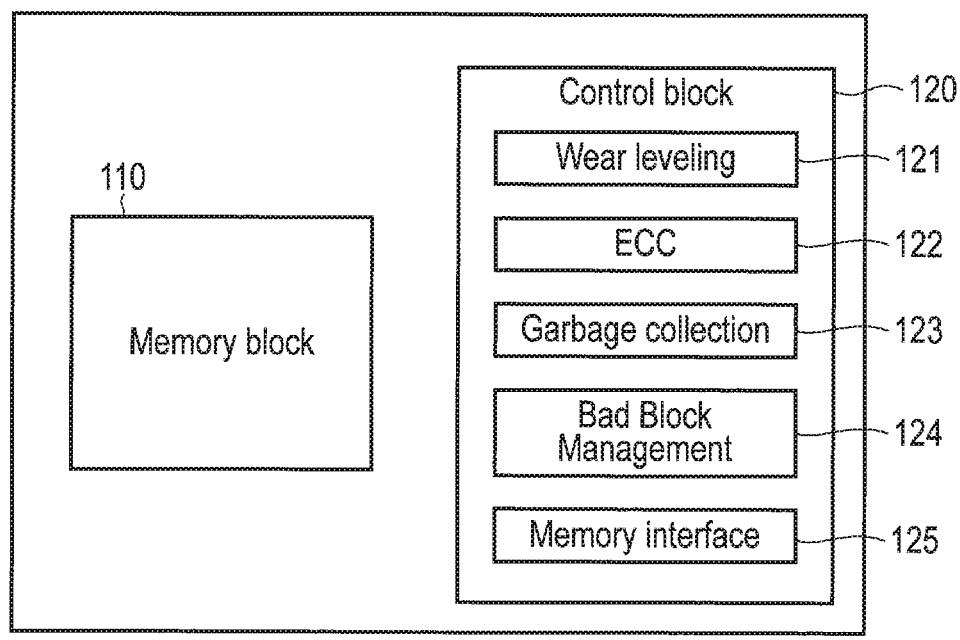
FIG. 10 is a block diagram illustrating the entire system structure including the nonvolatile memory device of the embodiment.

FIG. 10 is a block diagram illustrating the whole system structure including the nonvolatile memory device of the embodiment.

The system of FIG. 10 includes a memory block 110 and a control block 120.

The memory block 110 includes the structure of FIG. 9. Note that the switch controller 83 of FIG. 9 may be included in the memory block 110 or may be included in the control block 120.

The control block 120 controls the memory block 110, and includes a wear leveling unit 121, ECC unit 122, garbage collection unit 123, bad block management unit 124, and memory interface unit 125.

The control block 120 may be disposed outside the IC chip including the memory block 110, or, at least a part of the control block 120 may be included in the IC chip including the memory block 110.

With the control block 120, detection of defective selector portion and selection of word lines (switch of word lines) and the like can be performed.

Note that, in the above-described embodiment, a magnetoresistive element is used as the resistance change memory element; however, other resistance change memory elements may be used instead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
a plurality of wiring line pairs each including a pair of first and second wiring lines extending in a first direction;
a plurality of third wiring lines each extending in a second direction intersecting the first direction; and
a plurality of memory cells provided between the wiring line pairs and the third wiring lines,
wherein each of the memory cells comprises:
a resistance change memory element connected to a corresponding third wiring line from among the third wiring lines, and
a switching element structure including a first switching element portion provided between the resistance change memory element and the first wiring line included in a corresponding wiring line pair from among the wiring line pairs, and a second switching element portion provided between the resistance change memory element and the second wiring line included in the corresponding wiring line pair, and
wherein each of the first switching element portion and the second switching element portion exhibits an off state when a voltage applied thereto is smaller than a predetermined voltage, and exhibits an on state when a voltage applied thereto is greater than the predetermined voltage.

2. The device of claim 1, wherein:
the first switching element portion includes a first portion of a switching element material layer provided between the resistance change memory element and the first wiring line included in the corresponding wiring line pair, and
the second switching element portion includes a second portion of the switching element material layer provided between the resistance change memory element and the second wiring line included in the corresponding wiring line pair.

3. The device of claim 2, wherein the first portion of the switching element material layer and the second portion of the switching element material layer are provided continuously via a third portion of the switching element material layer.

4. The device of claim 3, wherein a thickness of the third portion of the switching element material layer is thinner than a thickness of the first portion of the switching element material layer and a thickness of the second portion of the switching element material layer.

5. The device of claim 2, wherein the first portion of the switching element material layer and the second portion of the switching element material layer are separated from each other.

6. The device of claim 2, wherein the switching element material layer is provided continuously between adjacent memory cells.

7. The device of claim 2, wherein the switching element material layer is separated between adjacent memory cells.

8. The device of claim 1, further comprising a plurality of selection circuits each selecting one of the first wiring line and the second wiring line included in the corresponding wiring line pair.

9. The device of claim 8, wherein each of the selection circuit selects, when the first switching element portion included in one of the memory cells connected to the corresponding wiring line pair is defective, the second wiring line included in the corresponding wiring line pair.

10. The device of claim 8, wherein each of the selection circuits switches the first wiring line to the second wiring line included in the corresponding wiring line pair based on a predetermined number of rewrites.

11. The device of claim 1, wherein each of the first switching element portion and the second switching element portion has a nonlinear current-voltage characteristic.

12. The device of claim 1, wherein read or write is performed on the resistance change memory element by setting one of the first switching element portion and the second switching element portion included in the corresponding wiring line pair to the on state.

13. The device of claim 1, wherein the resistance change memory element comprises a magnetoresistive element.

14. A nonvolatile memory device comprising:
a plurality of wiring line pairs each including a pair of first and second wiring lines extending in a first direction;
a plurality of third wiring lines each extending in a second direction intersecting the first direction; and
a plurality of memory cells provided between the wiring line pairs and the third wiring lines,
wherein:
each of the memory cells comprises:
a resistance change memory element connected to a corresponding third wiring line from among the third wiring lines, and
a switching element structure including a first switching element portion provided between the resistance change memory element and the first wiring line included in a corresponding wiring line pair from among the wiring line pairs, and a second switching element portion provided between the resistance change memory element and the second wiring line included in the corresponding wiring line pair,
the first switching element portion includes a first portion of a switching element material layer provided between the resistance change memory element and the first wiring line included in the corresponding wiring line pair,
the second switching element portion includes a second portion of the switching element material layer provided between the resistance change memory element and the second wiring line included in the corresponding wiring line pair, and
the first portion of the switching element material layer and the second portion of the switching element material layer are provided continuously via a third portion of the switching element material layer.

15. The device of claim 14, wherein a thickness of the third portion of the switching element material layer is thinner than a thickness of the first portion of the switching element material layer and a thickness of the second portion of the switching element material layer.

16. A nonvolatile memory device comprising:
a plurality of wiring line pairs each including a pair of first and second wiring lines extending in a first direction;
a plurality of third wiring lines each extending in a second direction intersecting the first direction; and a plurality of memory cells provided between the wiring line pairs and the third wiring lines,
wherein:
each of the memory cells comprises:
- a resistance change memory element connected to a corresponding third wiring line from among the third wiring lines, and
- a switching element structure including a first switching element portion provided between the resistance change memory element and the first wiring line included in a corresponding wiring line pair from among the wiring line pairs, and a second switching element portion provided between the resistance change memory element and the second wiring line included in the corresponding wiring line pair, the first switching element portion includes a first portion of a switching element material layer provided between the resistance change memory element and the first wiring line included in the corresponding wiring line pair, the second switching element portion includes a second portion of the switching element material layer provided between the resistance change memory element and the second wiring line included in the corresponding wiring line pair, and the switching element material layer is provided continuously between adjacent memory cells.

* * * * *